(12) United States Patent
Watanabe

(10) Patent No.: US 9,418,731 B1
(45) Date of Patent: Aug. 16, 2016

(54) MEMORY MANAGEMENT METHOD, MEMORY STORAGE DEVICE AND MEMORY CONTROL CIRCUIT UNIT

(71) Applicant: PHISON ELECTRONICS CORP., Miaoli (TW)

(72) Inventor: Hiroshi Watanabe, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/934,154

(22) Filed: Nov. 6, 2015

(51) Int. Cl.
*G11C 16/00* (2006.01)
*G11C 11/56* (2006.01)
*G11C 16/14* (2006.01)
*G11C 16/04* (2006.01)

(52) U.S. Cl.
CPC ............ *G11C 11/5635* (2013.01); *G11C 16/14* (2013.01); *G11C 16/0458* (2013.01)

(58) Field of Classification Search
CPC . G11C 11/5635; G11C 16/14; G11C 16/0458
USPC ............. 365/185.03, 185.02, 185.09, 185.24, 365/189.2
See application file for complete search history.

(56) References Cited

U.S. PATENT DOCUMENTS

| | | | | |
|---|---|---|---|---|
| 7,308,525 B2 * | 12/2007 | Lasser | ................ | G11C 11/5621 365/185.03 |
| 8,839,073 B2 * | 9/2014 | Cohen | ................. | G06F 11/1012 365/185.03 |
| 2010/0002504 A1 * | 1/2010 | Kim | ..................... | G11C 7/1006 365/185.03 |

* cited by examiner

*Primary Examiner* — Tan T. Nguyen
(74) *Attorney, Agent, or Firm* — Jianq Chyun IP Office

(57) ABSTRACT

A memory management method, a memory storage device and a memory control circuit unit are provided. The method comprises: obtaining a first threshold voltage distribution of memory cells; grouping the first threshold voltage distribution to a plurality of first threshold voltage groups; obtaining a second threshold voltage distribution of the memory cells; grouping the second threshold voltage distribution to a plurality of second threshold voltage groups; allocating a memory cell among the memory cells to a virtual block if a threshold voltage pair of the memory cell belongs to a specific group of the first threshold voltage groups and a specific group of the second threshold voltage groups, such that the first memory cell is operated under a specific-level cell mode. Accordingly, the reliability of memory cells may be improved without significantly sacrificing the capacity of the rewritable non-volatile memory module.

24 Claims, 13 Drawing Sheets

MEMORY MANAGEMENT METHOD, MEMORY STORAGE DEVICE AND MEMORY CONTROL CIRCUIT UNIT

BACKGROUND

1. Technical Field

The disclosure relates to a memory management method, and more particularly, relates to a memory management method, a memory storage device and a memory control circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multimedia devices as cited above.

Generally, in hybrid mode flash memory, some memory cells are used to store two or three bits (also known as digits thereinafter) per memory cell, and some other memory cells are used to store one single bit per memory cell. For example, some physical blocks are designed to be used for storing two or three bits per memory cell, and some other physical blocks are designed to be used for storing one single bit per memory cell. If some memory cells in one specific physical block have poor reliability and some other memory cells in the same physical block still have well reliability, then, in general case, all memory cells in this physical block are arranged to be used for storing one single bit per memory cell to increase the reliability of this physical block thereby. However, this procedure may cause the waste of data capacity because some memory cells with well reliabilities actually can still be used for storing multiple bits instead. Accordingly, how to design a manner to overcome the physical limitation and improve the reliability of each target memory cell is an important issue in the related technology field.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a memory management method, a memory storage device, and a memory control circuit unit, which may be capable of improving the reliability of memory cells without significantly sacrificing the capacity of the rewritable non-volatile memory module.

A memory management method for a rewritable non-volatile memory module comprising a plurality of memory cells, and the memory management method comprising: obtaining a first threshold voltage distribution of the memory cells; grouping the first threshold voltage distribution of the memory cells to a plurality of first threshold voltage groups; obtaining a second threshold voltage distribution of the memory cells; grouping the second threshold voltage distribution of the memory cells to a plurality of second threshold voltage groups, wherein a terminal threshold voltage of the first threshold voltage groups is lower than a terminal threshold voltage of the second threshold voltage groups; allocating a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode; and allocating a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode, wherein a terminal threshold voltage of the second group of the first threshold voltage groups is lower than a terminal threshold voltage of the first group of the first threshold voltage groups, wherein a terminal threshold voltage of the second group of the second threshold voltage groups is higher than a terminal threshold voltage of the first group of the second threshold voltage groups, wherein M and N are both positive integers and larger than 1, and N is larger than M.

A memory storage device according to another exemplary embodiment of the disclosure is provided. The memory storage device comprises a connection interface unit, a rewritable non-volatile memory module and a memory control circuit unit. The connection interface unit is configured to couple to a host system. The rewritable non-volatile memory module comprises a plurality of memory cells. The memory control circuit unit is coupled to the connection interface unit and the rewritable non-volatile memory module, wherein the memory control circuit unit is configured to obtain a first threshold voltage distribution of the memory cells, wherein the memory control circuit unit is further configured to group the first threshold voltage distribution of the memory cells to a plurality of first threshold voltage groups, wherein the memory control circuit unit is further configured to obtain a second threshold voltage distribution of the memory cells, wherein the memory control circuit unit is further configured to group the second threshold voltage distribution of the memory cells to a plurality of second threshold voltage groups, wherein a terminal threshold voltage of the first threshold voltage groups is lower than a terminal threshold voltage of the second threshold voltage groups, wherein the memory control circuit unit is further configured to allocate a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode, wherein the memory control circuit unit is further configured to allocate a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode, wherein a terminal threshold voltage of the second group of the first threshold voltage groups is lower than a terminal threshold voltage of the first group of the first threshold voltage groups, wherein a terminal threshold voltage of the second group of the second threshold voltage groups is higher than a terminal threshold voltage of the first group of the second threshold voltage groups, wherein M and N are both positive integers and larger than 1, and N is larger than M.

A memory control circuit unit configured to control a rewritable non-volatile memory module according to another exemplary embodiment of the disclosure is provided. The memory control circuit unit comprises a host interface, a memory interface and a memory management circuit. The host interface is configured to couple to a host system. The memory interface is configured to couple to the rewritable non-volatile memory module, wherein the rewritable non-volatile memory module comprises a plurality of memory cells. The memory management circuit is coupled to the host interface and the memory interface, wherein the memory management circuit is configured to obtain a first threshold voltage distribution of the memory cells, wherein the memory management circuit is further configured to group the first threshold voltage distribution of the memory cells to a plurality of first threshold voltage groups, wherein the memory management circuit is further configured to obtain a second threshold voltage distribution of the memory cells, wherein the memory management circuit is further configured to group the second threshold voltage distribution of the memory cells to a plurality of second threshold voltage groups, wherein a terminal threshold voltage of the first threshold voltage groups is lower than a terminal threshold voltage of the second threshold voltage groups, wherein the memory management circuit is further configured to allocate a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode, wherein the memory management circuit is further configured to allocate a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode, wherein a terminal threshold voltage of the second group of the first threshold voltage groups is lower than a terminal threshold voltage of the first group of the first threshold voltage groups, wherein a terminal threshold voltage of the second group of the second threshold voltage groups is higher than a terminal threshold voltage of the first group of the second threshold voltage groups, wherein M and N are both positive integers and larger than 1, and N is larger than M.

Based on the above, the threshold voltage distributions of memory cells are grouped to multiple first threshold voltage groups and multiple second threshold voltage groups, and accordingly, the memory cells are grouped to different virtual blocks for being operated under suitable programming modes. Therefore, the reliability of memory cells may be improved without significantly sacrificing the capacity of the rewritable non-volatile memory module.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are comprised to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
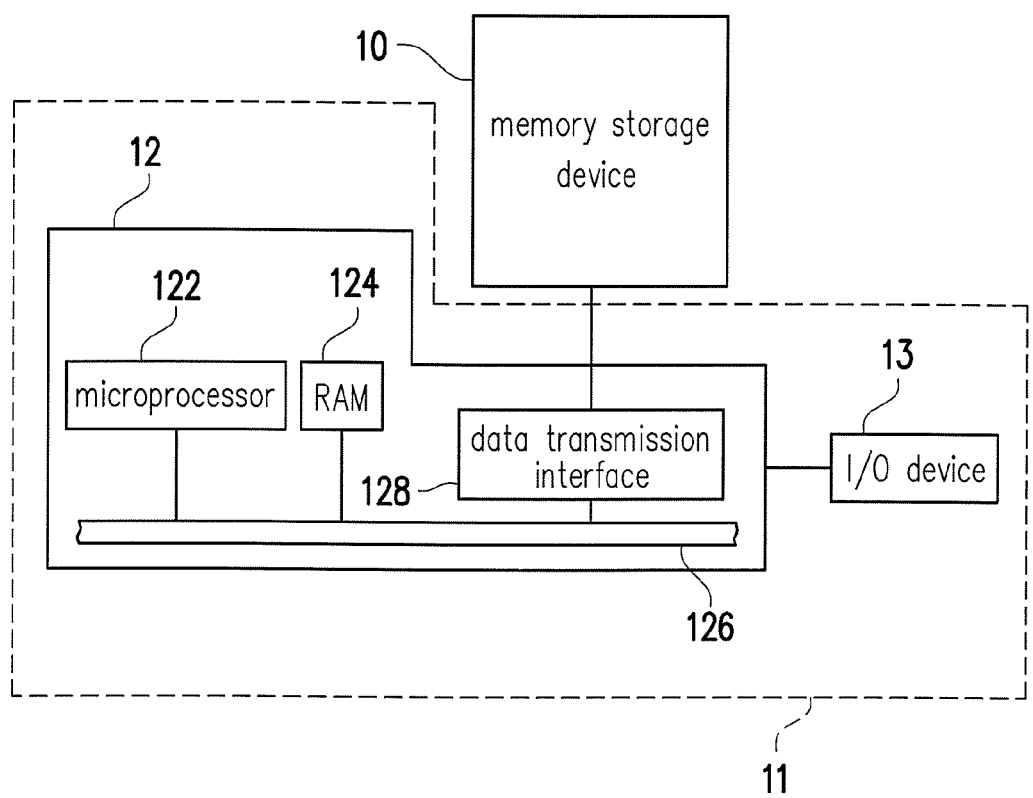
FIG. 1 is a schematic diagram illustrating a host system and a memory storage device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) comprises a rewritable non-volatile memory module and a controller (also known as a control circuit). The memory storage device is usually configured together with a host system so that the host system may write data to or read data from the memory storage device.

Figure 2:
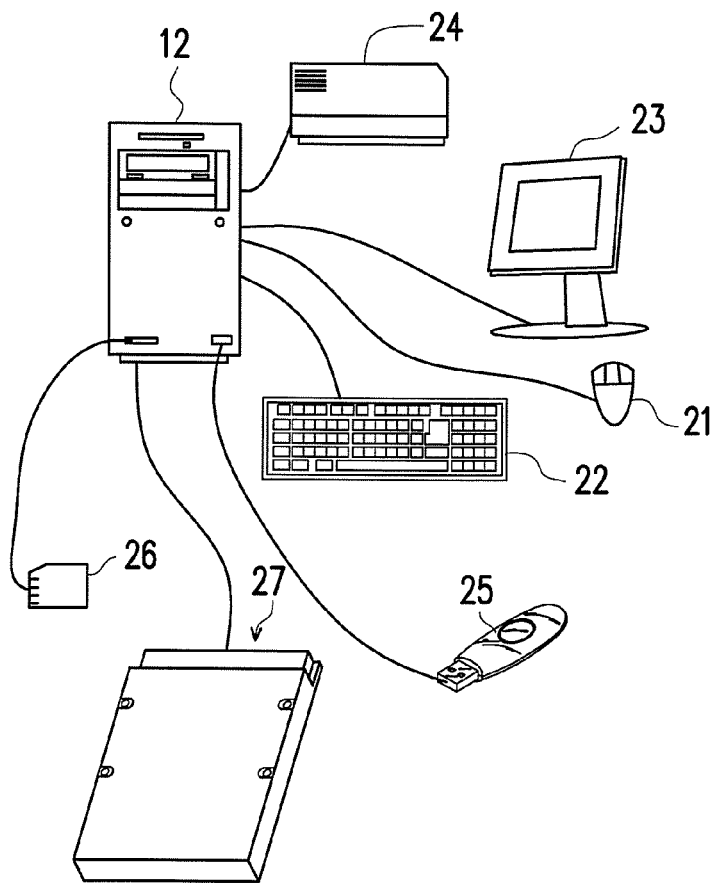
FIG. 2 is a schematic diagram of a computer, an input/output device, and a memory storage device according to an exemplary embodiment of the disclosure.

FIG. 1 is a schematic diagram illustrating a host system and a memory storage device according to an exemplary embodiment of the disclosure. FIG. 2 is a schematic diagram of a computer, an input/output device, and a memory storage device according to an exemplary embodiment of the disclosure.

Referring to FIG. 1, a host system 11 comprises a computer 12 and an input/output (I/O) device 13. The computer 12 comprises a microprocessor 122, a random access memory (RAM) 124, a system bus 126, and a data transmission interface 128. For example, the I/O device 13 comprises a mouse 21, a keyboard 22, a display 23 and a printer 24 as shown in FIG. 2. It should be understood that the devices illustrated in FIG. 2 are not intended to limit the I/O device 13, and the I/O device 13 may further comprise other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
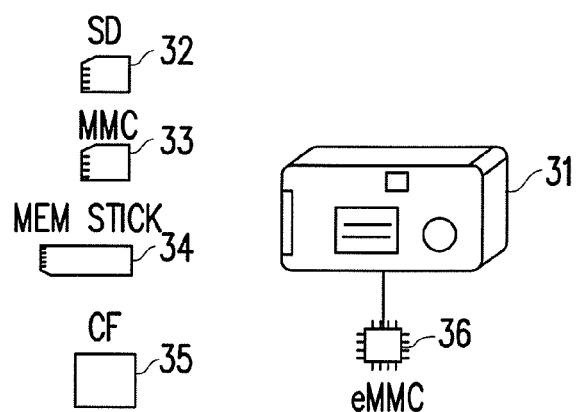
FIG. 3 is a schematic diagram illustrating a host system and a memory storage device according to an exemplary embodiment of the disclosure.

FIG. 3 is a schematic diagram illustrating a host system and a memory storage device according to an exemplary embodiment of the disclosure.

Generally, the host system 11 may be any system capable of substantially cooperating with the memory storage device 10 for storing data. In the present exemplary embodiment, the host system 11 is illustrated as a computer system. However, in another exemplary embodiment, the host system 11 may be a system such as a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 comprises an embedded MMC (eMMC). It should be mentioned that the eMMC is directly coupled to a substrate of the host system.

Figure 4:
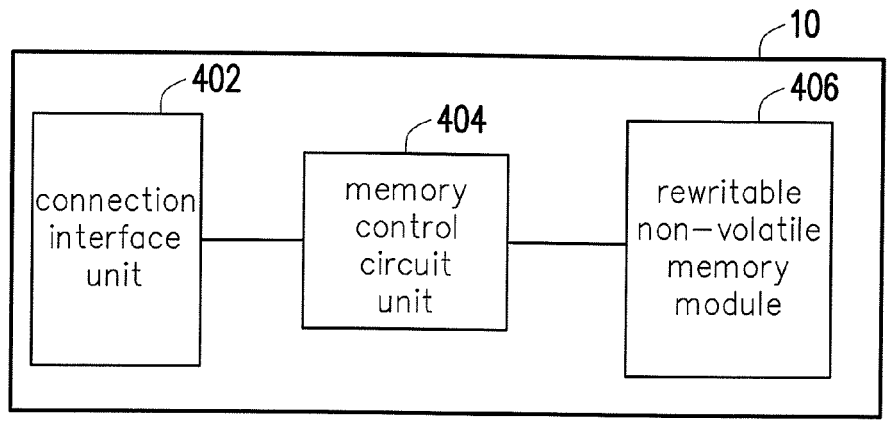
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a serial advanced technology attachment (SATA) standard. However, the disclosure is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form, so as to execute operations of writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a NAND flash memory module, a NOR flash memory module or other type of flash memory module.

Each of the memory cells in the rewritable non-volatile memory module 406 may store one or more bits (or digits) by changing a threshold voltage of the memory cell. In particular, in each of the memory cells, a charge storage layer is provided between a control gate and a channel. Amount of electrons in the charge storage layer may be changed by applying a write voltage to the control gate thereby changing the voltage of the memory cell. This process of changing the voltage is also known as "writing data into the memory cell" or "programming the memory cell". Each of the memory cells in the rewritable non-volatile memory module 406 has a plurality of storage statuses (also known as "states" thereinafter) depended on changes in threshold voltage. Moreover, to which the storage statuses that the memory cell belongs may be read by applying read voltages, so as to obtain data stored in the memory cell. In the present exemplary embodiment, the charge storage layer of each of the memory cells may be a floating gate or a charge trapping layer.

Figure 5:
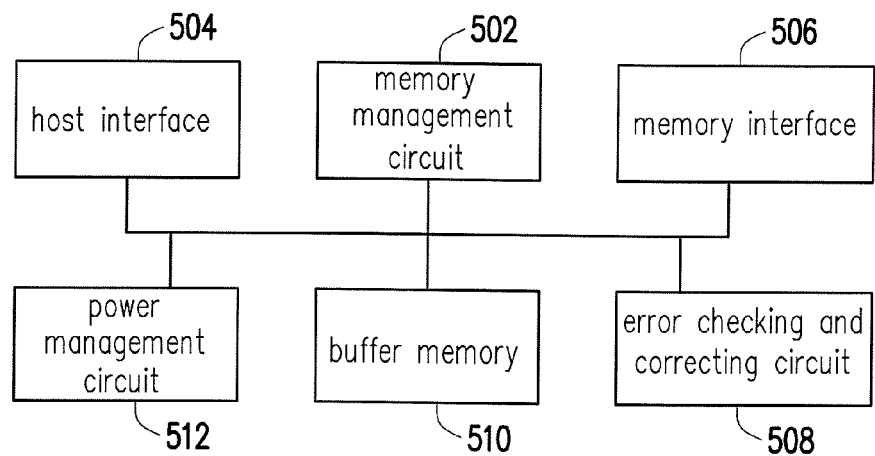
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504 and a memory interface 506.

The memory management circuit 502 is configured to control overall operations of the memory control circuit unit 404. In particular, the memory management circuit 502 has a plurality of control commands. During operations of the memory storage device 10, the control commands are executed to execute various operations such as writing, reading and erasing data. Operations of the memory management circuit 502 are similar to the operations of the memory control circuit unit 404, thus related description is omitted hereinafter.

In the present exemplary embodiment, the control commands of the memory management circuit 502 are implemented in a form of a firmware. For instance, the memory management circuit 502 has a microprocessor unit (not illustrated) and a ROM (not illustrated), and the control commands are burned into the ROM. While the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 while the memory control circuit unit 404 is operating. Thereinafter, the control commands are executed by the microprocessor unit to perform operations of writing, reading or erasing data.

Further, in another exemplary embodiment, the control commands of the memory management circuit 502 may also be implemented in a form of hardware. For example, the memory management circuit 502 includes a microcontroller, a memory writing circuit, a memory reading circuit, a memory erasing circuit and a data processing circuit. The memory writing circuit, the memory reading circuit, the memory erasing circuit and the data processing circuit are coupled to the microprocessor. The memory writing circuit is configured to issue a write command to the rewritable non-volatile memory module 406 in order to write data to the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 504 is coupled to the memory management circuit 502 and configured to receive and identify commands and data sent from the host system 11. In other words, the commands and data sent from the host system 11 are passed to the memory management circuit 502 through the host interface 504. In the present exemplary embodiment, the host interface 504 is compatible with a SATA standard. However, it should be understood that the present disclosure is not limited thereto, and the host interface 504 may also be compatible with a PATA standard, an IEEE 1394 standard, a PCI Express standard, a USB standard, an SD standard, a UHS-I standard, a UHS-II standard, an MS standard, an MMC standard, an eMMC standard, a UFS standard, a CF standard, an IDE standard, or other suitable standards for data transmission.

The memory interface 506 is coupled to the memory management circuit 502 and configured to access the rewritable non-volatile memory module 406. That is, data to be written to the rewritable non-volatile memory module 406 is converted to a format acceptable to the rewritable non-volatile memory module 406 through the memory interface 506. In particular, if the memory management circuit 502 intends to access the rewritable non-volatile memory module 406, the memory interface 506 sends corresponding command sequences. The command sequences may include one or more signals, or data from the bus. For example, in a read command sequence, information such as identification codes and memory addresses are included.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to execute an error checking and correcting process to ensure the correctness of data. In particular, when the memory management circuit 502 receives the writing command from the host system 11, the error checking and correcting circuit 508 generates an error correcting code (ECC) and/or an error detecting code (EDC) for data corresponding to the writing command, and the memory management circuit 502 writes the data and the corresponding ECC and/or the EDC to the rewritable non-volatile memory module 406. Subsequently, when the memory management circuit 502 reads the data from the rewritable non-volatile memory module 406, the corresponding ECC and/or the EDC is also read from the rewritable non-volatile memory module 406, and the error checking and correcting circuit 508 executes the error checking and correcting process for the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In the present exemplary embodiment, the memory cells in the rewritable non-volatile memory module 406 constitute a plurality of physical programming units, and the physical programming units constitute a plurality of physical erasing units. In particular, the memory cells on the same word line constitute one or more physical programming units. The physical programming unit is a minimum unit for programming. That is, the physical programming unit is the minimum unit for writing data. For example, the physical programming unit is a physical page or a physical sector. The physical erasing unit is the minimal unit for erasing. Namely, each physical erasing unit contains the least number of memory cells to be erased together. For instance, the physical erasing unit is a physical block.

Figure 6:
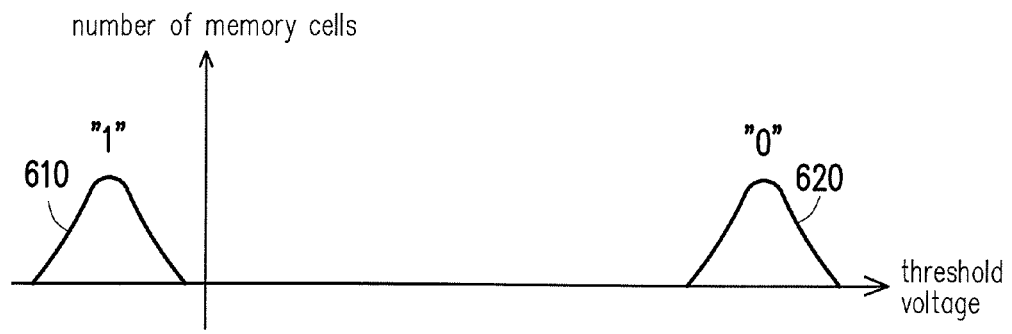
FIG. 6 is a schematic diagram illustrating a threshold voltage distribution of memory cells according to an exemplary embodiment of the disclosure.

FIG. 6 is a schematic diagram illustrating a threshold voltage distribution of memory cells according to an exemplary embodiment of the disclosure.

Referring to FIG. 6, after data is written into plural memory cells, the threshold voltage distribution of those memory cells includes two states 610 and 620. For example, the state 610 with lower threshold voltage peak represents data "1", and the state 620 with higher threshold voltage peak represents data "0". By applying a read voltage between the states 610 and 620 to those memory cells, the data stored in the memory cells may be obtained. For example, responding to the applied read voltage, a memory cell with threshold voltage lower than the applied read voltage may be identified as storing data "1", and another memory cell with threshold voltage higher than the applied read voltage may be identified as storing data "0". However, in another exemplary embodiment, the state 610 may represent data "0", and the state 620 may represent data "1".

In the present exemplary embodiment, each of the memory cells including two states (e.g., states 610 and 620) is also referred as being operated under a two-level cell (2LC) mode (also known as 2LC programming mode). Each memory cell operated in the 2LC mode is configured to store one bit of data (i.e., data "1" or data "0") per cell.

Figure 7:
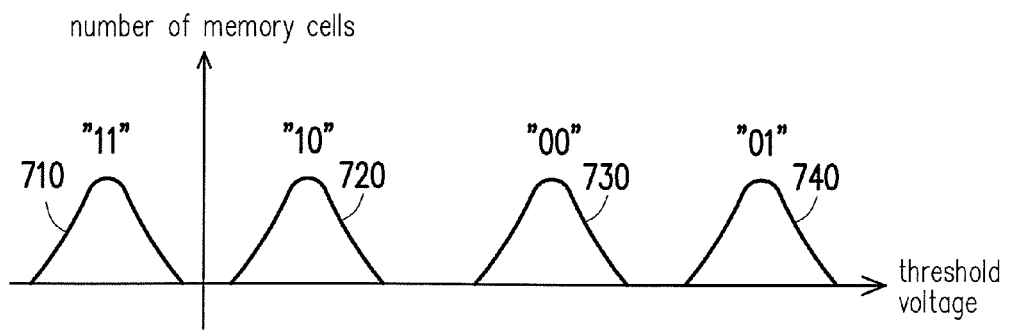
FIG. 7 is a schematic diagram illustrating a threshold voltage distribution of memory cells according to another exemplary embodiment of the disclosure.

FIG. 7 is a schematic diagram illustrating a threshold voltage distribution of memory cells according to another exemplary embodiment of the disclosure.

Referring to FIG. 7, after data is written into plural memory cells, the threshold voltage distribution of those memory cells includes four states 710 to 740. The states 710 to 740 represents data "11", "10", "00" and "01", respectively. By applying different read voltages to the memory cells, the data stored in the memory cells may be obtained.

In the present exemplary embodiment, each of the memory cells including four states is also referred as being operated under a four-level cell (4LC) mode (also known as 4LC programming mode). Each memory cell operated in the 4LC mode is configured to store two bits of data per cell. However, the data represented by each of the states 710 to 740 may be different depending on different design.

Figure 8:
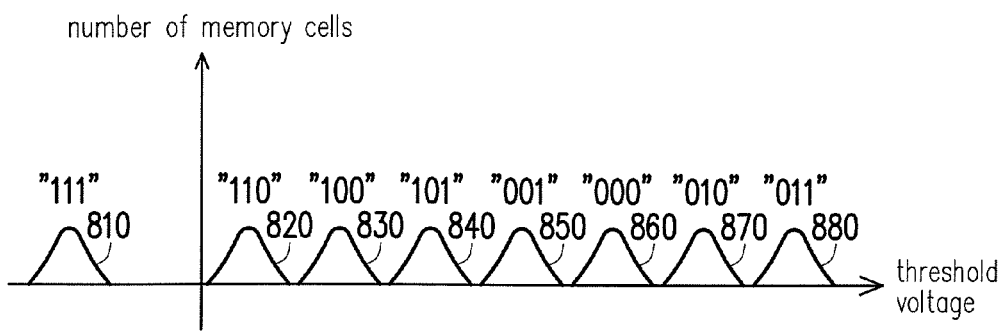
FIG. 8 is a schematic diagram illustrating a threshold voltage distribution of memory cells according to another exemplary embodiment of the disclosure.

FIG. 8 is a schematic diagram illustrating a threshold voltage distribution of memory cells according to another exemplary embodiment of the disclosure.

Referring to FIG. 8, after data is written into plural memory cells, the threshold voltage distribution of those memory cells includes eight states 810 to 880. The states 810 to 880 represents data "111", "110", "100", "101", "001", "000", "010" and "011", respectively. By applying different read voltages to the memory cells, the data stored in the memory cells may be obtained. However, the data represented by each of the states 810 to 880 may be different depending on different design.

In the present exemplary embodiment, each of the memory cells including eight states is also referred as being operated under an eight-level cell (8LC) mode (also known as 8LC programming mode). Each memory cell operated in the 8LC mode is configured to store three bits of data per cell.

It is noted that, in another exemplary embodiment, the number of states of each memory cell may also be three, five, six, seven or more, which is not limited thereby. In other words, each memory cell may be operated under a specific-level cell mode, where the specific-level cell mode may be the 2LC mode, the 3LC mode, the 4LC mode, 5LC mode, 6LC mode and so on. In the present exemplary embodiment, if a specific memory cell is operated under an M-level cell (MLC) mode, it means the specific memory cell includes M states (or M peaks) per cell. For example, M is positive integer larger than 1.

However, after memory cells are programmed and erased repeatedly (i.e., through plural P/E cycles), each peak of the threshold voltage distribution of the memory cells may become degraded (i.e., flatter and wider), and the error in the data stored in those memory cells may increase.

Figure 9A:
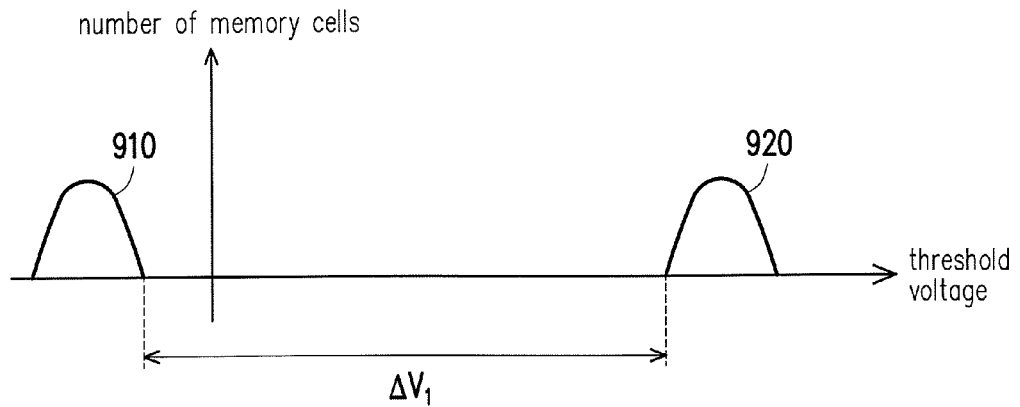
FIGS. 9A and 9B are schematic diagrams illustrating a normal threshold voltage distribution and a degraded threshold voltage distribution according to an exemplary embodiment of the disclosure, respectively.
Figure 9B:
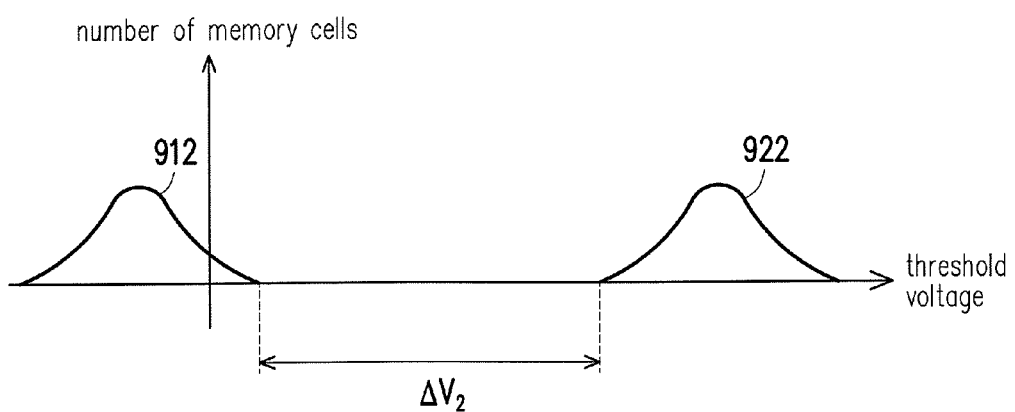

FIGS. 9A and 9B are schematic diagrams illustrating a normal threshold voltage distribution and a degraded threshold voltage distribution according to an exemplary embodiment of the disclosure, respectively.

Referring to FIG. 9A which takes a normal threshold voltage distribution of memory cells operated under 2LC mode as an example, a gap $\Delta V_1$ between the right end of the state 910 which represents data "1" and the left end of the state 920 which represents data "0" is very wide. For example, the gap $\Delta V_1$ may be wide enough to allow the memory cells being further operated under 3LC mode, 4LC mode, 5LC mode or so on.

Referring to FIG. 9B, after those memory cells are programmed and erased repeatedly or suffers other influences (e.g., thermal effect at high temperature), a degraded threshold voltage distribution of those memory cells may be obtained. The degraded threshold voltage distribution includes states 912 and 922. For example, the state 912 represents data "1", and the state 922 represents data "0". The gap $\Delta V_2$ between the right end of the state 912 and the left end of the state 922 is narrower than the gap $\Delta V_1$, as shown in FIG. 9A. If the threshold voltage distribution is degraded, as shown in FIG. 9B, then some of memory cells are not suitable for being operated under a programming mode with states being more than two.

In the above exemplary embodiment, the state 910 or 912 is a most-erased state of the memory cells, and the state 920 or 922 is a most-programmed state of the memory cells. Further, a most-erased threshold voltage distribution of the most-erased state and the most-programmed threshold voltage distribution of the most-programmed state are used to determine the programming mode of memory system.

Figure 10A:
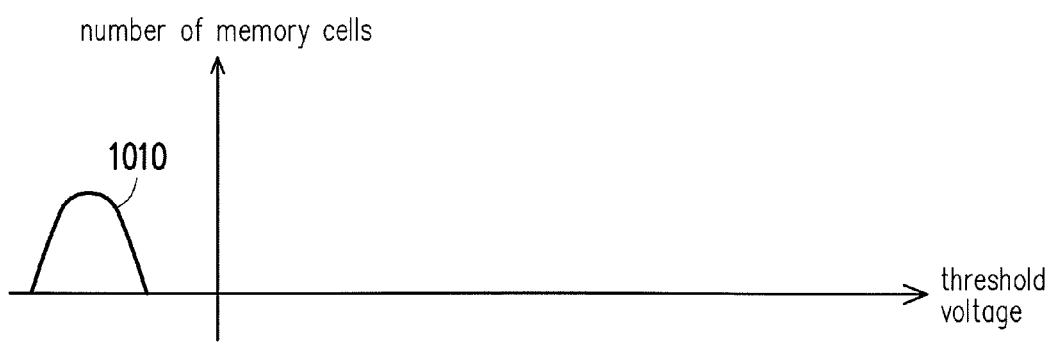
FIGS. 10A and 10B are schematic diagrams illustrating a most-erased threshold voltage distribution and a most-programmed threshold voltage distribution according to an exemplary embodiment of the disclosure, respectively.
Figure 10B:
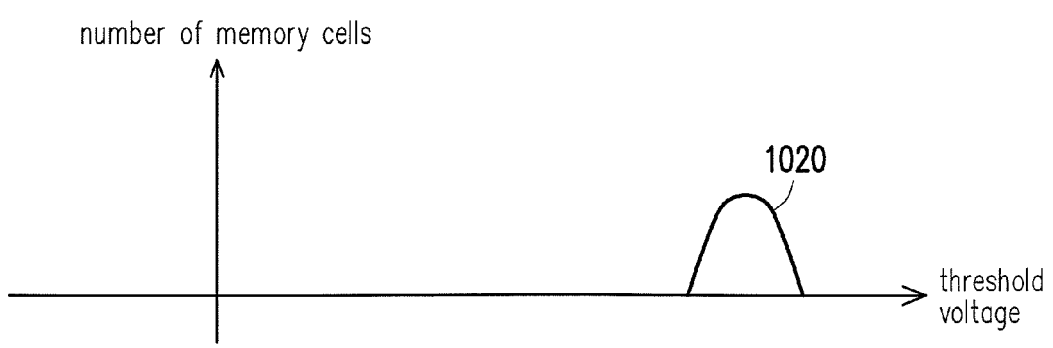

FIGS. 10A and 10B are schematic diagrams illustrating a most-erased threshold voltage distribution and a most-programmed threshold voltage distribution according to an exemplary embodiment of the disclosure, respectively.

Referring to FIG. 10A, the memory management circuit 502 instructs the rewritable non-volatile memory module 406 to erase each of the memory cells and records threshold voltage of each of the erased memory cells, so as to obtain the threshold voltage distribution 1010 of the erased memory cells (also known as first threshold voltage distribution thereinafter). In the present exemplary embodiment, the threshold voltage distribution 1010 is also regarded as a most-erased threshold voltage distribution of the memory cells.

Referring to FIG. 10B, the memory management circuit 502 further instructs the rewritable non-volatile memory module 406 to program each of the memory cells and records threshold voltage of each of the programmed memory cells, so as to obtain the threshold voltage distribution 1020 of the programmed memory cells (also known as second threshold voltage distribution thereinafter). In the present exemplary embodiment, the threshold voltage distribution 1020 is also regarded as a most-programmed threshold voltage distribution of the memory cells.

FIGS. 11A to 11E are schematic diagrams illustrating a grouping process according to an exemplary embodiment of the disclosure.

Figure 11A:
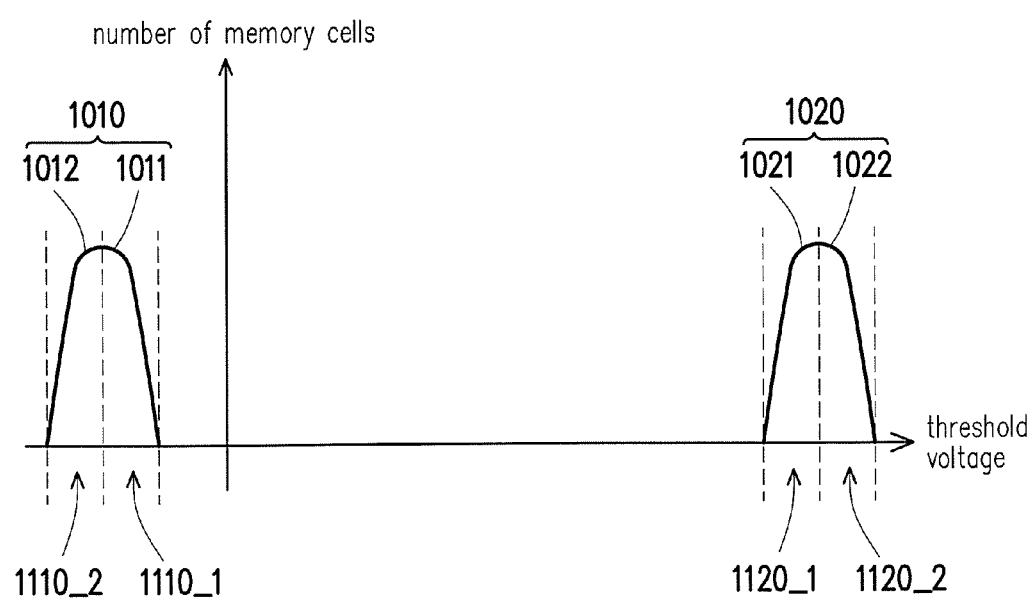
FIGS. 11A to 11E are schematic diagrams illustrating a grouping process according to an exemplary embodiment of the disclosure.

Referring to FIG. 11A, the memory management circuit 502 groups the threshold voltage distribution 1010 to the groups 1110_1 and 1110_2, and the memory management circuit 502 groups the threshold voltage distribution 1020 to the groups 1120_1 and 1120_2. In the present exemplary embodiment, the groups 1110_1 and 1110_2 are also referred as the first threshold voltage groups, and the groups 1120_1 and 1120_2 are also referred as the second threshold voltage groups.

To be specific, the threshold voltage distribution 1011 (e.g., the right part of the threshold voltage distribution 1010) is grouped to the group 1110_1, and the threshold voltage distribution 1012 (e.g., the left part of the threshold voltage distribution 1010) is grouped to the group 1110_2; the threshold voltage distribution 1021 (e.g., the left part of the threshold voltage distribution 1020) is grouped to the group 1120_1, and the threshold voltage distribution 1022 (e.g., the right part of the threshold voltage distribution 1020) is grouped to the group 1120_2.

A terminal threshold voltage of the groups 1110_1 and 1110_2 is lower than a terminal threshold voltage of the groups 1120_1 and 1120_2. For example, the terminal threshold voltage of the groups 1110_1 and 1110_2 may be regarded as the threshold voltage corresponding to the left end of the threshold voltage distribution 1010 or the threshold voltage corresponding to the right end of the threshold voltage distribution 1010; the terminal threshold voltage of the groups 1120_1 and 1120_2 may be regarded as the threshold voltage corresponding to the left end of the threshold voltage distribution 1020 or the threshold voltage corresponding to the right end of the threshold voltage distribution 1020. Further, in another exemplary embodiment, the terminal threshold voltage of the groups 1110_1 and 1110_2 may also be regarded as the threshold voltage corresponding to any point on the threshold voltage distribution 1010, and the terminal threshold voltage of the groups 1120_1 and 1120_2 may also be regarded as the threshold voltage corresponding to any point on the threshold voltage distribution 1020. In addition, a terminal threshold voltage of the group 1110_1 is higher than that of the group 1110_2, and a terminal threshold voltage of the group 1120_2 is higher than that of the group 1120_1.

Figure 11B:
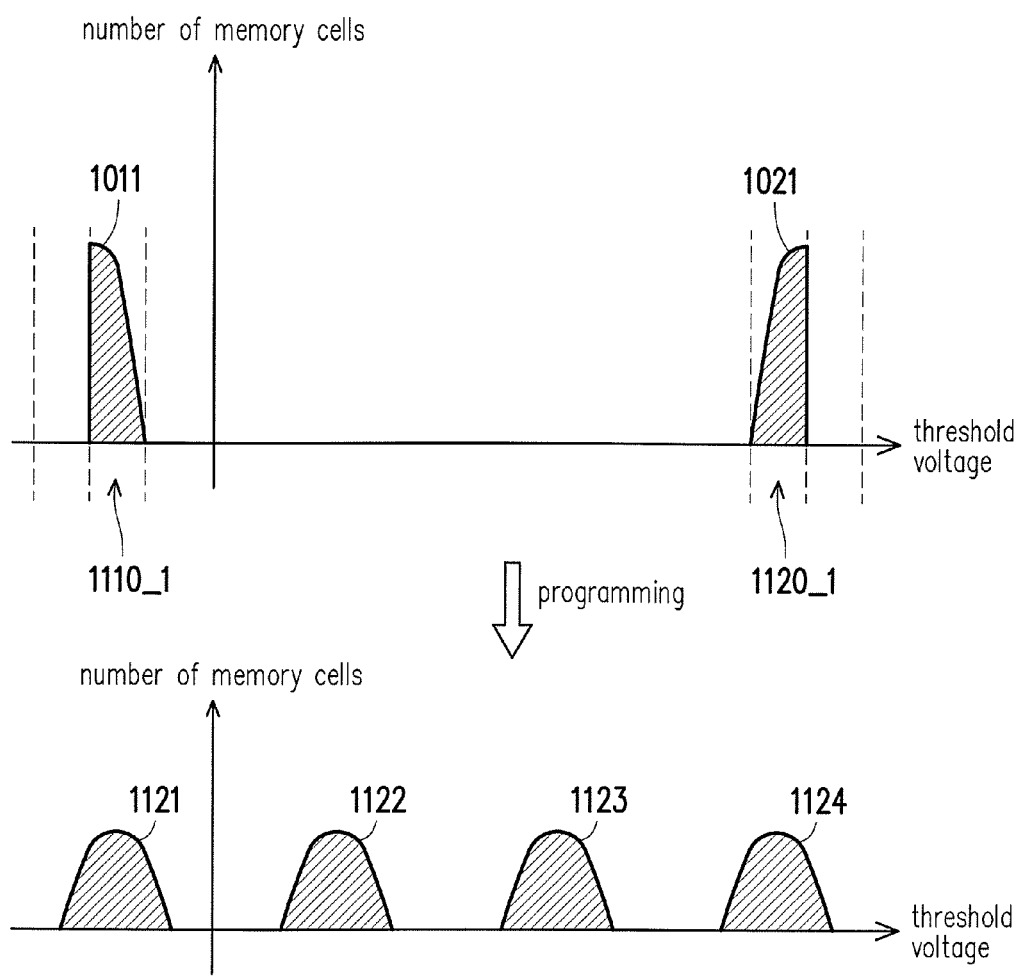

Referring to FIG. 11B, the memory management circuit 502 groups the memory cells having the threshold voltage pairs within the group 1110_1 and the group 1120_1 to at least one virtual block (also known as first virtual block thereinafter). In the present exemplary embodiment, each memory cell in the first virtual block is configured to be operated in a M-level cell (MLC) mode, where M is a positive integer bigger than 1.

To be specific, the memory management circuit 502 selects a memory cell from among the memory cells constructing the threshold voltage distributions 1010 and 1020. Then, the memory management circuit 502 groups the selected memory cell to the first virtual block if a most-erased threshold voltage of the selected memory cell belongs to the group 1110_1 and a most-programmed threshold voltage of the selected memory cell belongs to the 1120_1, such that the memory cell is configured to be operated under the MLC mode. In the present exemplary embodiment, M is 4. For example, after the memory cells in the first virtual block are programmed, the threshold voltage distribution of the programmed memory cells includes four states 1121 to 1124, as shown in FIG. 11B.

However, in another exemplary embodiment, M may be 2, 3, 5 or any larger number depending on the gap between the location (e.g., the right end) of the group 1110_1 and the location (e.g., the left end) of the group 1120_1. For example, M may be positively correlated to the width of the gap between the right end of the group 1110_1 and the left end of the group 1120_1; if the gap between the right end of the group 1110_1 and the left end of the group 1120_1 is wider, M may become larger; if the gap between the right end of the group 1110_1 and the left end of the group 1120_1 is narrower, M may become smaller.

Figure 11C:
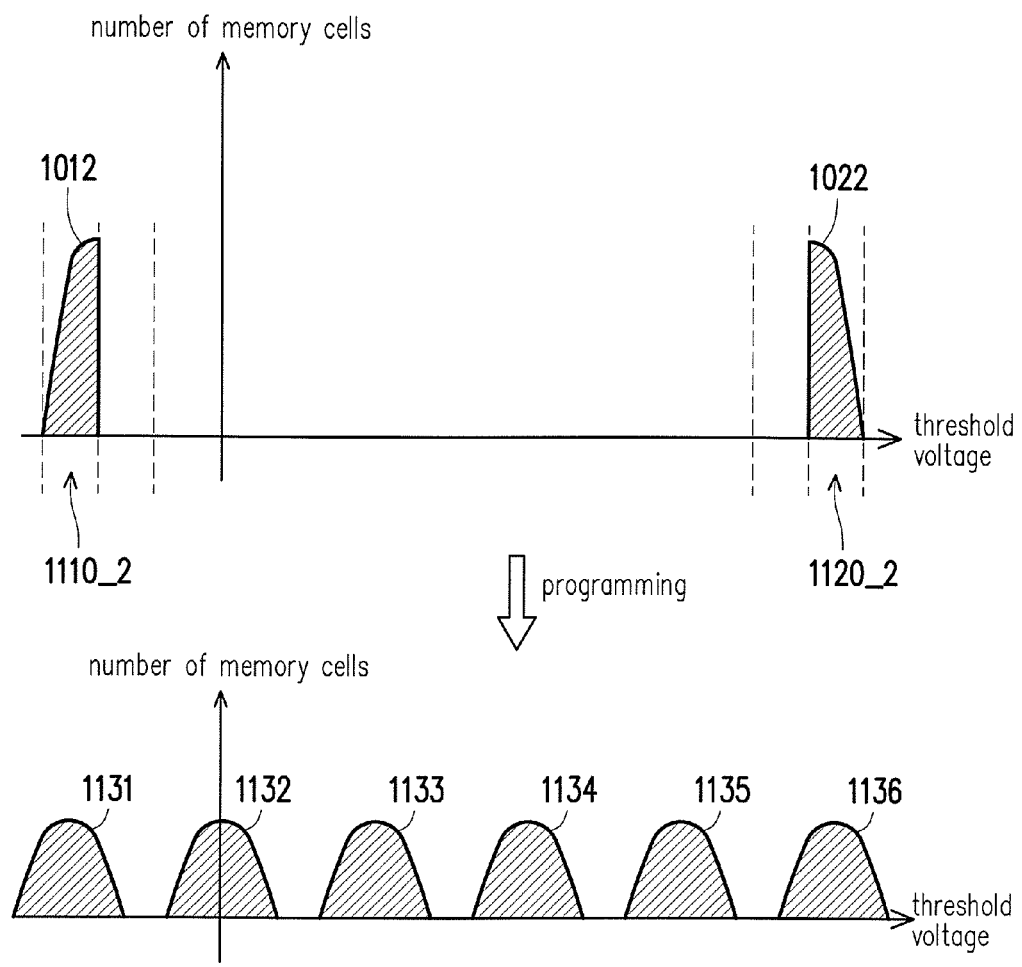

Referring to FIG. 11C, the memory management circuit 502 further groups the memory cells having the threshold voltage pairs within the group 1110_2 and the group 1120_2 to another at least one virtual block (also known as second virtual block thereinafter). In the present exemplary embodiment, each memory cell in the second virtual block is configured to be operated in an N-level cell mode, where N is a positive integer and larger than M.

To be specific, after selecting a memory cell from among the memory cells constructing the threshold voltage distributions 1010 and 1020, the memory management circuit 502 groups the selected memory cell to the second virtual block if a most-erased threshold voltage of the selected memory cell belongs to the group 1110_2 and a most-programmed threshold voltage of the selected memory cell belongs to the 1120_2, such that the memory cell is configured to be operated under the N-level cell mode. In the present exemplary embodiment, N is 6, such that each memory cell in the second virtual block is configured to be operated under 6LC mode. For example, after the memory cells in the second virtual block are programmed, the threshold voltage distribution of the programmed memory cells includes six states 1131 to 1136, as shown in FIG. 11C.

Figure 11D:
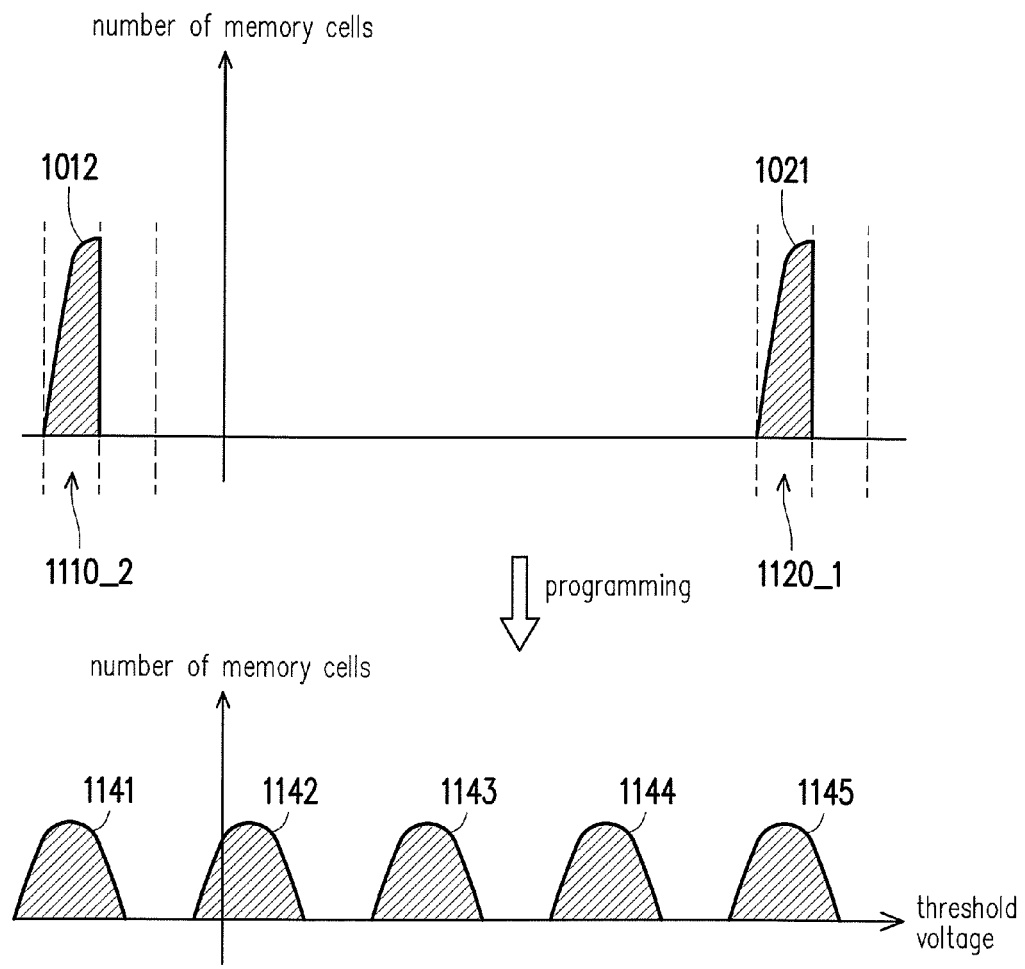

Referring to FIG. 11D, the memory management circuit 502 further groups the memory cells having the threshold voltage pairs within the group 1110_2 and the group 1120_1 to another at least one virtual block (also known as third virtual block thereinafter). In the present exemplary embodiment, each memory cell in the third virtual block is configured to be operated in a Q-level cell mode, where Q is a positive integer smaller than N.

To be specific, after selecting a memory cell from among the memory cells constructing the threshold voltage distributions 1010 and 1020, the memory management circuit 502 groups the selected memory cell to the third virtual block if a most-erased threshold voltage of the selected memory cell belongs to the group 1110_2 and a most-programmed threshold voltage of the selected memory cell belongs to the 1120_1, such that the memory cell is configured to be operated under the Q-level cell mode. In the present exemplary embodiment, Q is 5, such that each memory cell in the third virtual block is configured to be operated under 5LC mode. For example, after the memory cells in the third virtual block are programmed, the threshold voltage distribution of the programmed memory cells includes five states 1141 to 1145, as shown in FIG. 11D.

Figure 11E:
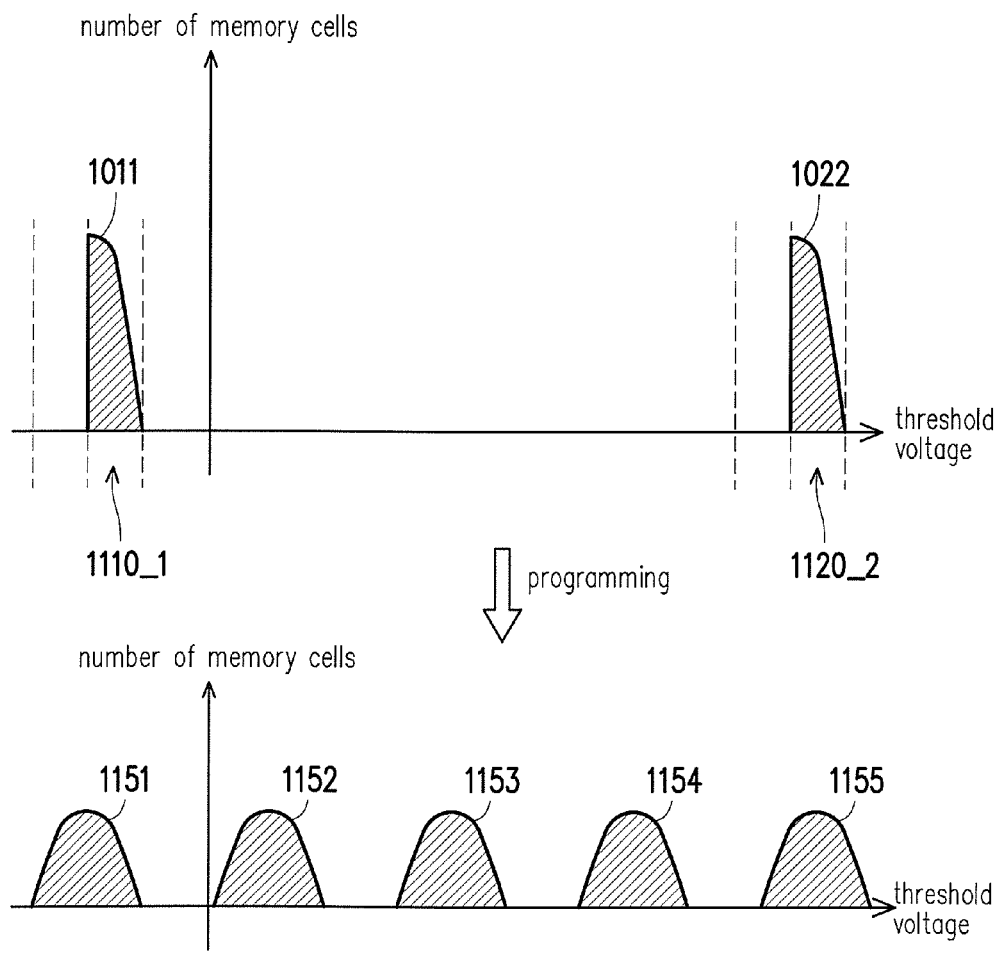

Referring to FIG. 11E, the memory management circuit 502 further groups the memory cells having the threshold voltage pairs within the group 1110_1 and the group 1120_2 to another at least one virtual block (also known as fourth virtual block thereinafter). In the present exemplary embodiment, each memory cell in the fourth virtual block is also configured to be operated in the Q'-level cell mode.

To be specific, after selecting a memory cell from among the memory cells constructing the threshold voltage distributions 1010 and 1020, the memory management circuit 502 groups the selected memory cell to the fourth virtual block if a most-erased threshold voltage of the selected memory cell belongs to the group 1110_1 and a most-programmed threshold voltage of the selected memory cell belongs to the 1120_2, such that the memory cell is configured to be operated under the Q'-level cell mode. For example, after the memory cells in the fourth virtual block are programmed, the threshold voltage distribution of the programmed memory cells includes five states 1151 to 1155, as shown in FIG. 11E. For example, the threshold voltage distribution including the states 1151 to 1155 are similar to the threshold voltage distribution including the states 1141 to 1145. In this exemplary embodiment, Q and Q' are the same integer. But, in another exemplary embodiment, Q and Q' are not necessary to be the same.

In another exemplary embodiment, the first threshold voltage distribution (i.e., the most-erased threshold voltage distribution) and the second threshold voltage distribution (i.e., the most-programmed threshold voltage distribution) are grouped to more than two groups, respectively. For example, the memory management circuit 502 further analyzes the first threshold voltage distribution and the second threshold voltage distribution and determines a first number of the first threshold voltage groups and a second number of the second threshold voltage groups according to an analyzing result.

Figure 12:
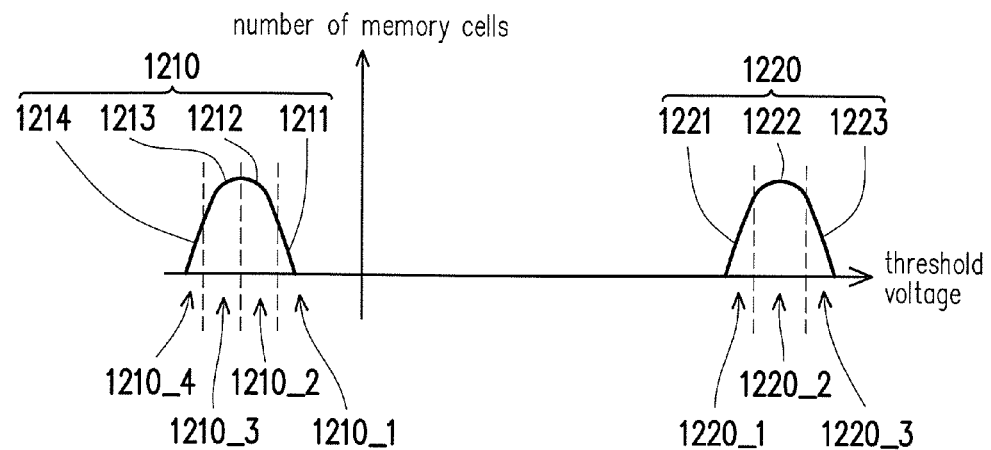
FIG. 12 is a schematic diagram illustrating a grouping process according to another exemplary embodiment of the disclosure.

FIG. 12 is a schematic diagram illustrating a grouping process according to another exemplary embodiment of the disclosure.

Referring to FIG. 12, the memory management circuit 502 groups the threshold voltage distribution 1210 (i.e., the most-erased threshold voltage distribution) to four groups 1210_1 to 1210_4 and groups the threshold voltage distribution 1220 (i.e., the most-programmed threshold voltage distribution) to three groups 1220_1 to 1210_3. For example, group 1210_1 covers voltage distribution 1211, group 1210_2 covers voltage distribution 1212, group 1210_3 covers voltage distribution 1213, and group 1210_4 covers voltage distribution 1214; group 1220_1 covers voltage distribution 1221, group 1220_2 covers voltage distribution 1222, and group 1220_3 covers voltage distribution 1223.

In the present exemplary embodiment, a memory cell having a threshold voltage pair within the group 1210_1 and the group 1220_1 is grouped to a virtual block, such that the memory cell is configured to be operated under the MLC mode. A memory cell having a threshold voltage pair within the group 1210_2 and the group 1220_1 (or the group 1210_1 and the group 1220_2) is grouped to another virtual block, such that the memory cell is configured to be operated under the (M+1)LC mode. A memory cell having a threshold voltage pair within the group 1210_3 and the group 1220_1 (or the group 1210_1 and the group 1220_3, or the group 1210_2 and the group 1220_2) is grouped to another virtual block, such that the memory cell is configured to be operated under the (M+2)LC mode. A memory cell having a threshold voltage pair within the group 1210_4 and the group 1220_1 (or the group 1210_1 and the group 1220_4, or the group 1210_2 and the group 1220_3, or the group 1210_3 and the group 1220_2) is grouped to another virtual block, such that the memory cell is configured to be operated under the (M+3)LC mode. A memory cell having a threshold voltage pair within the group 1210_4 and the group 1220_2 (or the group 1210_2 and the group 1220_4) is grouped to another virtual block, such that the memory cell is configured to be operated under the (M+4)LC mode. A memory cell having a threshold voltage pair within the group 1210_4 and the group 1220_3 is grouped to another virtual block, such that the memory cell is configured to be operated under the (M+5)LC mode.

Figure 13:
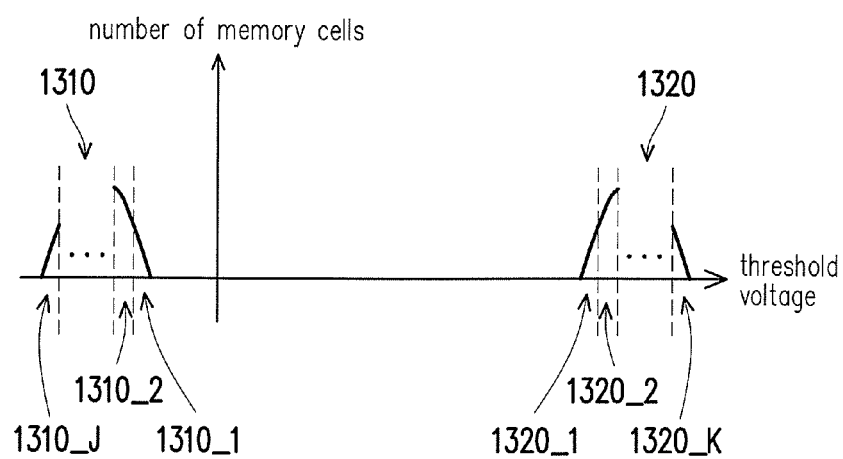
FIG. 13 is a schematic diagram illustrating a grouping process according to another exemplary embodiment of the disclosure.

FIG. 13 is a schematic diagram illustrating a grouping process according to another exemplary embodiment of the disclosure.

Referring to FIG. 13, the memory management circuit 502 groups the threshold voltage distribution 1310 (i.e., the most-erased threshold voltage distribution) to J groups 1310_1 to 1310_J and groups the threshold voltage distribution 1320 (i.e., the most-programmed threshold voltage distribution) to K groups 1320_1 to 1310_K. That is, in the present exemplary embodiment, the first number is J, the second number is K, where J and K are both integers larger than 1. For example, a memory cell having a threshold voltage pair within the group 1210_j ($0<j<J+1$) and the group 1220_k ($0<k<K+1$) is grouped to a specific virtual block, such that the memory cell is configured to be operated under the (M+j+k−2)LC mode.

In an exemplary embodiment, the grouped memory cells mentioned above are located in at least one physical unit (also known as first physical unit) of the rewritable non-volatile memory module 406. Each physical unit may be a physical address, a physical programming unit or a physical erasing unit. The memory management circuit 502 stores grouping information corresponding to each address of the grouped memory cells into another at least one physical unit (also known as second physical unit) of the rewritable non-volatile memory module 406. A reliability of the second physical unit is higher than that of the first physical unit. For example, the first physical unit is included in a user data area of the rewritable non-volatile memory module 406, and the second physical unit is included in a system data area of the rewritable non-volatile memory module 406. The user data area is used for storing user data from the host system 11 (e.g., write data), and the system data area is used for storing system data (e.g., the management tables).

In an exemplary embodiment, each memory cell located in the second physical unit is only operated under the 2LC mode. In addition, in an exemplary embodiment, the memory management circuit 502 only performs the group process mentioned above on the memory cells located in the first physical unit.

Figure 14:
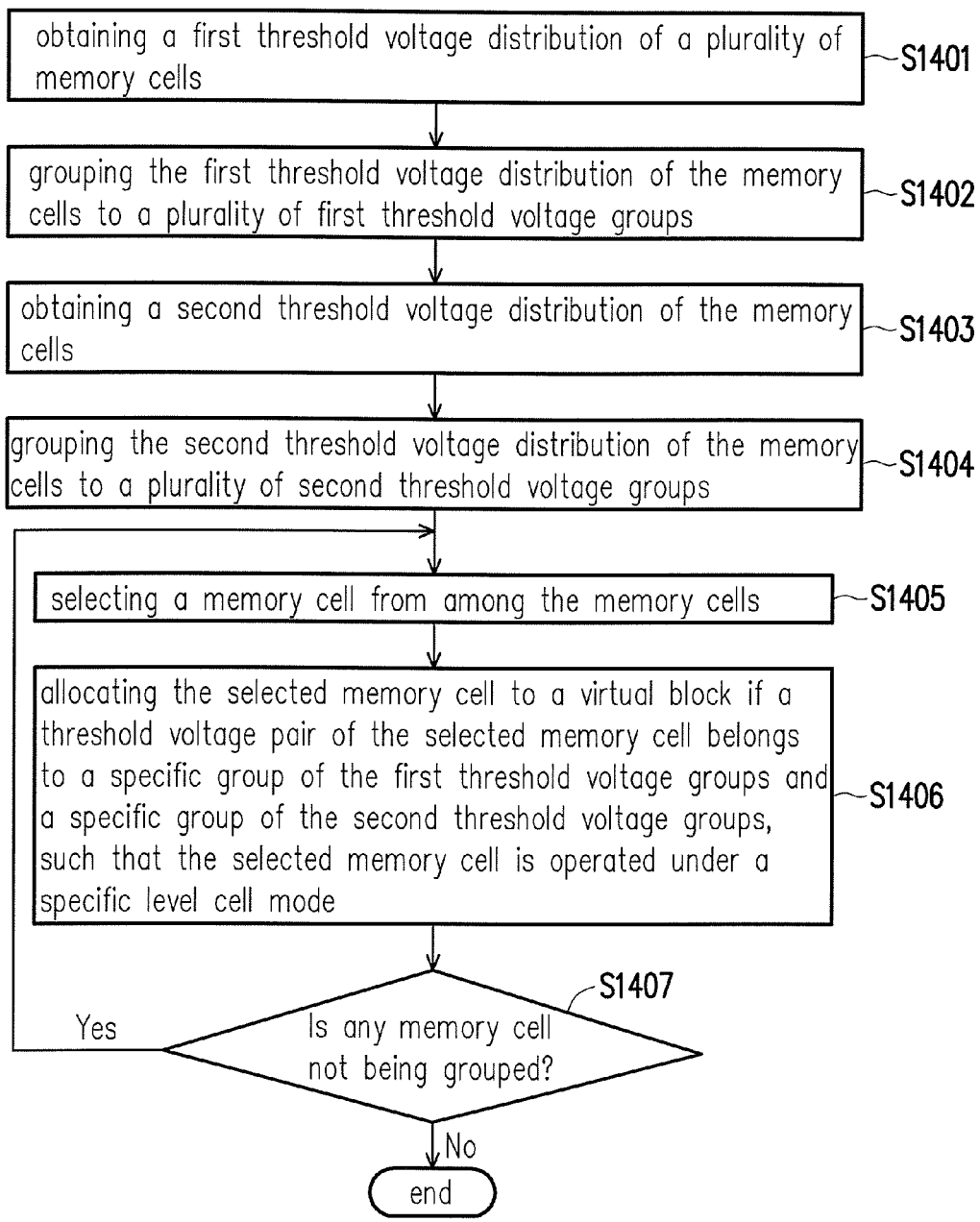
FIG. 14 is a flowchart illustrating a memory management method according to an exemplary embodiment of the disclosure.

FIG. 14 is a flowchart illustrating a memory management method according to an exemplary embodiment of the disclosure.

Referring to FIG. 14, in step S1401, a first threshold voltage distribution of memory cells of a rewritable non-volatile memory module is obtained. In step 1402, the first threshold voltage distribution is grouped to a plurality of first threshold voltage groups. In step 1403, a second threshold voltage distribution of the memory cells is obtained. In step 1404, the second threshold voltage distribution is grouped to a plurality of second threshold voltage groups, where a terminal threshold voltage of the first threshold voltage groups is lower than a terminal threshold voltage of the second threshold voltage groups. In step 1405, a memory cell is selected from among said memory cells. In step 1406, the selected memory cell is allocated to a virtual block if a threshold voltage pair of the selected memory cell belongs to a specific group of the first threshold voltage groups and a specific group of the second threshold voltage groups, such that the selected memory cell is operated under a specific-level cell mode. In step 1407, it is determined whether any memory cell is not being grouped. If there is still at least one memory cell not being grouped yet, the step 1405 is repeated; otherwise, goes to the end.

However, each step of FIG. 14 has been described in detail above and will not repeated hereinafter. It should be noted that each of the steps illustrated in FIG. 14 may be implemented as a plurality of program codes or circuits, but construes no limitations to the present disclosure. Additionally, the methods illustrated in FIG. 14 may be implemented together with the exemplary embodiments above or may be performed solely, and the present disclosure is not limited thereto.

In summary, the threshold voltage distributions of memory cells are grouped to multiple first threshold voltage groups and multiple second threshold voltage groups, and accordingly, each single memory cell may belong to a specific virtual block for being operated under a suitable programming mode. Therefore, the reliability of each single memory cell may be improved without significantly sacrificing the capacity of the rewritable non-volatile memory module. In an exemplary embodiment, physical boundaries of the physical locations of multiple memory cells may be broken by using the virtual blocks.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory management method for a rewritable non-volatile memory module comprising a plurality of memory cells, and the memory management method comprising:
   obtaining a first threshold voltage distribution of the memory cells;
   grouping the first threshold voltage distribution of the memory cells to a plurality of first threshold voltage groups;

obtaining a second threshold voltage distribution of the memory cells;

grouping the second threshold voltage distribution of the memory cells to a plurality of second threshold voltage groups, wherein a terminal threshold voltage of the first threshold voltage groups is lower than a terminal threshold voltage of the second threshold voltage groups;

allocating a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode; and allocating a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode, wherein a terminal threshold voltage of the second group of the first threshold voltage groups is lower than a terminal threshold voltage of the first group of the first threshold voltage groups, wherein a terminal threshold voltage of the second group of the second threshold voltage groups is higher than a terminal threshold voltage of the first group of the second threshold voltage groups, wherein M and N are both positive integers and larger than 1, and N is larger than M.

2. The memory management method of claim 1, wherein the first threshold voltage distribution of the memory cells is a most-erased threshold voltage distribution of the memory cells, wherein the second threshold voltage distribution of the memory cells is a most-programmed threshold voltage distribution of the memory cells.

3. The memory management method of claim 2, wherein the step of obtaining the first threshold voltage distribution of the memory cells comprises:

erasing each of the memory cells and recording a most-erased threshold voltage of each of the memory cells, wherein the step of obtaining the second threshold voltage distribution of the memory cells comprises:

programming each of the memory cells and recording a most-programmed threshold voltage of each of the memory cells.

4. The memory management method of claim 1, wherein the memory cells are located in at least one first physical unit of the rewritable non-volatile memory module, wherein the memory management method further comprises:

storing grouping information corresponding to each address of the memory cells into at least one second physical unit of the rewritable non-volatile memory module, wherein a reliability of the at least one second physical unit is higher than a reliability of the at least one first physical unit.

5. The memory management method of claim 1, further comprising:

allocating a third memory cell among the memory cells to a third virtual block if a third threshold voltage pair of the third memory cell belongs to a third group of the first threshold voltage groups and a third group of the second threshold voltage groups, such that the third memory cell is operated under a Q-level cell mode, wherein a terminal threshold voltage of the third group of the first threshold voltage groups is lower than the terminal threshold voltage of the first group of the first threshold voltage groups, wherein a terminal threshold voltage of the third group of the second threshold voltage groups is higher than or equal to the terminal threshold voltage of the first group of the second threshold voltage groups, wherein Q is a positive integer smaller than N and larger than M.

6. The memory management method of claim 5, further comprising:

allocating a fourth memory cell among the memory cells to the third virtual block if a fourth threshold voltage pair of the fourth memory cell belongs to a fourth group of the first threshold voltage groups and a fourth group of the second threshold voltage groups, such that the fourth memory cell is operated under the Q-level cell mode, wherein a terminal threshold voltage of the fourth group of the first threshold voltage groups is lower than or equal to the terminal threshold voltage of the first group of the first threshold voltage groups, wherein a terminal threshold voltage of the fourth group of the second threshold voltage groups is higher than the teiininal threshold voltage of the first group of the second threshold voltage groups.

7. The memory management method of claim 1, further comprising:

analyzing the first threshold voltage distribution of the memory cells and the second threshold voltage distribution of the memory cells; and determining a first number of the first threshold voltage groups and a second number of the second threshold voltage groups according to an analyzing result.

8. The memory management method of claim 7, wherein the first number is J, wherein the second number is K, wherein J and K are both integers larger than 1, wherein N is equal to M+J+K−2.

9. A memory storage device, comprising:

a connection interface unit, configured to couple to a host system;

a rewritable non-volatile memory module comprising a plurality of memory cells; and a memory control circuit unit, coupled to the connection interface unit and the rewritable non-volatile memory module, wherein the memory control circuit unit is configured to obtain a first threshold voltage distribution of the memory cells, wherein the memory control circuit unit is further configured to group the first threshold voltage distribution of the memory cells to a plurality of first threshold voltage groups, wherein the memory control circuit unit is further configured to obtain a second threshold voltage distribution of the memory cells, wherein the memory control circuit unit is further configured to group the second threshold voltage distribution of the memory cells to a plurality of second threshold voltage groups, wherein a terminal threshold voltage of the first threshold voltage groups is lower than a terminal threshold voltage of the second threshold voltage groups, wherein the memory control circuit unit is further configured to allocate a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode, wherein the memory control circuit unit is further configured to allocate a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode, wherein a terminal threshold voltage of the second group of the first threshold voltage groups is lower than a terminal threshold voltage of the first group of the first threshold voltage groups, wherein a terminal threshold voltage of the second group of the second threshold voltage groups is higher than a terminal threshold voltage of the first group of the second threshold voltage groups, wherein M and N are both positive integers and larger than 1, and N is larger than M.

10. The memory storage device of claim 9, wherein the first threshold voltage distribution of the memory cells is a most-erased threshold voltage distribution of the memory cells, wherein the second threshold voltage distribution of the memory cells is a most-programmed threshold voltage distribution of the memory cells.

11. The memory storage device of claim 10, wherein the operation of the memory control circuit unit obtaining the first threshold voltage distribution of the memory cells comprises:

erasing each of the memory cells and recording a most-erased threshold voltage of each of the memory cells, wherein the operation of the memory control circuit unit of obtaining the second threshold voltage distribution of the memory cells comprises:

programming each of the memory cells and recording a most-programmed threshold voltage of each of the memory cells.

12. The memory storage device of claim 9, wherein the memory cells are located in at least one first physical unit of the rewritable non-volatile memory module, wherein the memory control circuit unit is further configured to store grouping information corresponding to each address of the memory cells into at least one second physical unit of the rewritable non-volatile memory module, wherein a reliability of the at least one second physical unit is higher than a reliability of the at least one first physical unit.

13. The memory storage device of claim 9, wherein the memory control circuit unit is further configured to allocate a third memory cell among the memory cells to a third virtual block if a third threshold voltage pair of the third memory cell belongs to a third group of the first threshold voltage groups and a third group of the second threshold voltage groups, such that the third memory cell is operated under a Q-level cell mode, wherein a terminal threshold voltage of the third group of the first threshold voltage groups is lower than the terminal threshold voltage of the first group of the first threshold voltage groups, wherein a terminal threshold voltage of the third group of the second threshold voltage groups is higher than or equal to the terminal threshold voltage of the first group of the second threshold voltage groups, wherein Q is a positive integer smaller than N and larger than M.

14. The memory storage device of claim 13, wherein the memory control circuit unit is further configured to allocate a fourth memory cell among the memory cells to the third virtual block if a fourth threshold voltage pair of the fourth memory cell belongs to a fourth group of the first threshold voltage groups and a fourth group of the second threshold voltage groups, such that the fourth memory cell is operated under the Q-level cell mode, wherein a terminal threshold voltage of the fourth group of the first threshold voltage groups is lower than or equal to the terminal threshold voltage of the first group of the first threshold voltage groups, wherein a terminal threshold voltage of the fourth group of the second threshold voltage groups is higher than the terminal threshold voltage of the first group of the second threshold voltage groups.

15. The memory storage device of claim 9, wherein the memory control circuit unit is further configured to analyze the first threshold voltage distribution of the memory cells and the second threshold voltage distribution of the memory cells, wherein the memory control circuit unit is further configured to determine a first number of the first threshold voltage groups and a second number of the second threshold voltage groups according to an analyzing result.

16. The memory storage device of claim 15, wherein the first number is J, wherein the second number is K, wherein J and K are both integers larger than 1, wherein N is equal to $M+J+K-2$.

17. A memory control circuit unit, configured to control a rewritable non-volatile memory module, and the memory control circuit unit comprising:

a host interface, configured to couple to a host system;

a memory interface, configured to couple to the rewritable non-volatile memory module, wherein the rewritable non-volatile memory module comprises a plurality of memory cells; and a memory management circuit coupled to the host interface and the memory interface, wherein the memory management circuit is configured to obtain a first threshold voltage distribution of the memory cells, wherein the memory management circuit is further configured to group the first threshold voltage distribution of the memory cells to a plurality of first threshold voltage groups, wherein the memory management circuit is further configured to obtain a second threshold voltage distribution of the memory cells, wherein the memory management circuit is further configured to group the second threshold voltage distribution of the memory cells to a plurality of second threshold voltage groups, wherein a terminal threshold voltage of the first threshold voltage groups is lower than a terminal threshold voltage of the second threshold voltage groups, wherein the memory management circuit is further configured to allocate a first memory cell among the memory cells to a first virtual block if a first threshold voltage pair of the first memory cell belongs to a first group of the first threshold voltage groups and a first group of the second threshold voltage groups, such that the first memory cell is operated under an M-level cell mode, wherein the memory management circuit is further configured to allocate a second memory cell among the memory cells to a second virtual block if a second threshold voltage pair of the second memory cell belongs to a second group of the first threshold voltage groups and a second group of the second threshold voltage groups, such that the second memory cell is operated under an N-level cell mode,
    wherein a terminal threshold voltage of the second group of the first threshold voltage groups is lower than a terminal threshold voltage of the first group of the first threshold voltage groups,
    wherein a terminal threshold voltage of the second group of the second threshold voltage groups is higher than a terminal threshold voltage of the first group of the second threshold voltage groups,
    wherein M and N are both positive integers and larger than 1, and N is larger than M.

18. The memory control circuit unit of claim 17, wherein the first threshold voltage distribution of the memory cells is a most-erased threshold voltage distribution of the memory cells,
    wherein the second threshold voltage distribution of the memory cells is a most-programmed threshold voltage distribution of the memory cells.

19. The memory control circuit unit of claim 18, wherein the operation of the memory management circuit obtaining the first threshold voltage distribution of the memory cells comprises:
    erasing each of the memory cells and recording a most-erased threshold voltage of each of the memory cells,
    wherein the operation of the memory management circuit of obtaining the second threshold voltage distribution of the memory cells comprises:
    programming each of the memory cells and recording a most-programmed threshold voltage of each of the memory cells.

20. The memory control circuit unit of claim 17, wherein the memory cells are located in at least one first physical unit of the rewritable non-volatile memory module,
    wherein the memory management circuit is further configured to store grouping information corresponding to each address of the memory cells into at least one second physical unit of the rewritable non-volatile memory module,
    wherein a reliability of the at least one second physical unit is higher than a reliability of the at least one first physical unit.

21. The memory control circuit unit of claim 17, wherein the memory management circuit is further configured to allocate a third memory cell among the memory cells to a third virtual block if a third threshold voltage pair of the third memory cell belongs to a third group of the first threshold voltage groups and a third group of the second threshold voltage groups, such that the third memory cell is operated under a Q-level cell mode,
    wherein a terminal threshold voltage of the third group of the first threshold voltage groups is lower than the terminal threshold voltage of the first group of the first threshold voltage groups,
    wherein a terminal threshold voltage of the third group of the second threshold voltage groups is higher than or equal to the terminal threshold voltage of the first group of the second threshold voltage groups,
    wherein Q is a positive integer smaller than N and larger than M.

22. The memory control circuit unit of claim 21, wherein the memory management circuit is further configured to allocate a fourth memory cell among the memory cells to the third virtual block if a fourth threshold voltage pair of the fourth memory cell belongs to a fourth group of the first threshold voltage groups and a fourth group of the second threshold voltage groups, such that the fourth memory cell is operated under the Q-level cell mode,
    wherein a terminal threshold voltage of the fourth group of the first threshold voltage groups is lower than or equal to the terminal threshold voltage of the first group of the first threshold voltage groups,
    wherein a terminal threshold voltage of the fourth group of the second threshold voltage groups is higher than the terminal threshold voltage of the first group of the second threshold voltage groups.

23. The memory control circuit unit of claim 17, wherein the memory management circuit is further configured to analyze the first threshold voltage distribution of the memory cells and the second threshold voltage distribution of the memory cells,
    wherein the memory management circuit is further configured to determine a first number of the first threshold voltage groups and a second number of the second threshold voltage groups according to an analyzing result.

24. The memory control circuit unit of claim 23, wherein the first number is J, wherein the second number is K, wherein J and K are both integers larger than 1,
    wherein N is equal to M+J+K−2.

* * * * *